US010720339B2

(12) United States Patent
Kawano et al.

(10) Patent No.: US 10,720,339 B2
(45) Date of Patent: Jul. 21, 2020

(54) FAN-OUT WAFER-LEVEL PACKAGING METHOD AND THE PACKAGE PRODUCED THEREOF

(71) Applicant: AGENCY FOR SCIENCE, TECHNOLOGY AND RESEARCH, Singapore (SG)

(72) Inventors: Masaya Kawano, Singapore (SG); Ka Fai Chang, Singapore (SG)

(73) Assignee: AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 0 days.

(21) Appl. No.: 16/300,538

(22) PCT Filed: Apr. 27, 2017

(86) PCT No.: PCT/SG2017/050229
§ 371 (c)(1),
(2) Date: Nov. 9, 2018

(87) PCT Pub. No.: WO2017/196257
PCT Pub. Date: Nov. 16, 2017

(65) Prior Publication Data
US 2019/0393051 A1      Dec. 26, 2019

(30) Foreign Application Priority Data

May 10, 2016   (SG) .......................... 10201603724V

(51) Int. Cl.
*H01L 21/56* (2006.01)
*H01L 23/31* (2006.01)
(Continued)

(52) U.S. Cl.
CPC ........ *H01L 21/561* (2013.01); *H01L 23/3114* (2013.01); *H01L 23/3128* (2013.01);
(Continued)

(58) Field of Classification Search
CPC ....... H01L 21/561; H01L 21/56; H01L 23/31; H01L 23/3114; H01L 23/3128;
(Continued)

(56) References Cited

U.S. PATENT DOCUMENTS 5,374,564 A    12/1994 Bruel
8,946,884 B2    2/2015 Kwon et al.
(Continued)

OTHER PUBLICATIONS

International Search Report and the Written Opinion of the International Searching Authority for International Application No. PCT/SG2017/050229 dated Jun. 30, 2017.
(Continued)

*Primary Examiner* — Fazli Erdem
(74) *Attorney, Agent, or Firm* — Womble Bond Dickinson (US) LLP

(57) ABSTRACT

A fan-out wafer-level packaging method and the package produced thereof are provided in the present application. The method comprises steps including: providing a silicon substrate layer having a first thickness; forming one or more active/passive devices comprising at least sources and drains and one or more diffusion layers adjoining the sources and drains, wherein forming the one or more active/passive devices comprises forming the sources and the drains in a front-end-of-line (FEOL) layer on a first side of the silicon substrate layer while forming the one or more diffusion layers at locations in the silicon substrate layer adjoining the sources and the drains; forming a redistribution layer (RDL) over the FEOL layer by copper damascene formation of multiple metallization layers for connecting the one or more active/passive devices to the one or more IC dies when the one or more IC dies are mounted on a side of the RDL opposite the FEOL layer; thinning the silicon substrate layer to a second thickness to form a thinned silicon substrate, the thinned silicon substrate comprising at least the one or more
(Continued)

diffusion layers; and patterning the thinned silicon substrate to form one or more silicon regions, each of the one or more silicon regions comprising the one or more diffusion layers.

15 Claims, 7 Drawing Sheets

(51) Int. Cl.
*H01L 23/00* (2006.01)
*H01L 23/60* (2006.01)

(52) U.S. Cl.
CPC ............ *H01L 23/562* (2013.01); *H01L 23/60* (2013.01); *H01L 24/19* (2013.01); *H01L 24/20* (2013.01); *H01L 24/97* (2013.01); *H01L 2924/1432* (2013.01); *H01L 2924/1434* (2013.01); *H01L 2924/15311* (2013.01); *H01L 2924/18161* (2013.01); *H01L 2924/19041* (2013.01); *H01L 2924/19042* (2013.01); *H01L 2924/19043* (2013.01); *H01L 2924/19105* (2013.01); *H01L 2924/3511* (2013.01)

(58) Field of Classification Search
CPC ....... H01L 23/562; H01L 23/60; H01L 24/19; H01L 24/20; H01L 24/97
USPC .......................................................... 257/668
See application file for complete search history.

(56) References Cited

U.S. PATENT DOCUMENTS

| | | |
|---|---|---|
| 2002/0081838 A1 | 6/2002 | Bohr |
| 2009/0170242 A1* | 7/2009 | Lin .................... H01L 21/6835 |
| | | 438/107 |
| 2014/0001639 A1 | 1/2014 | Hiraishi et al. |
| 2014/0252599 A1 | 9/2014 | Kwon et al. |
| 2015/0235921 A1 | 8/2015 | Shen |
| 2015/0250058 A1 | 9/2015 | Ramachandran et al. |
| 2017/0117260 A1* | 4/2017 | Prabhu .................... H01L 24/19 |
| 2017/0301649 A1* | 10/2017 | Wu .......................... H01L 24/32 |

OTHER PUBLICATIONS

PCT International Preliminary Report on Patentability for PCT/SG2017/050229 dated Apr. 19, 2018.

* cited by examiner

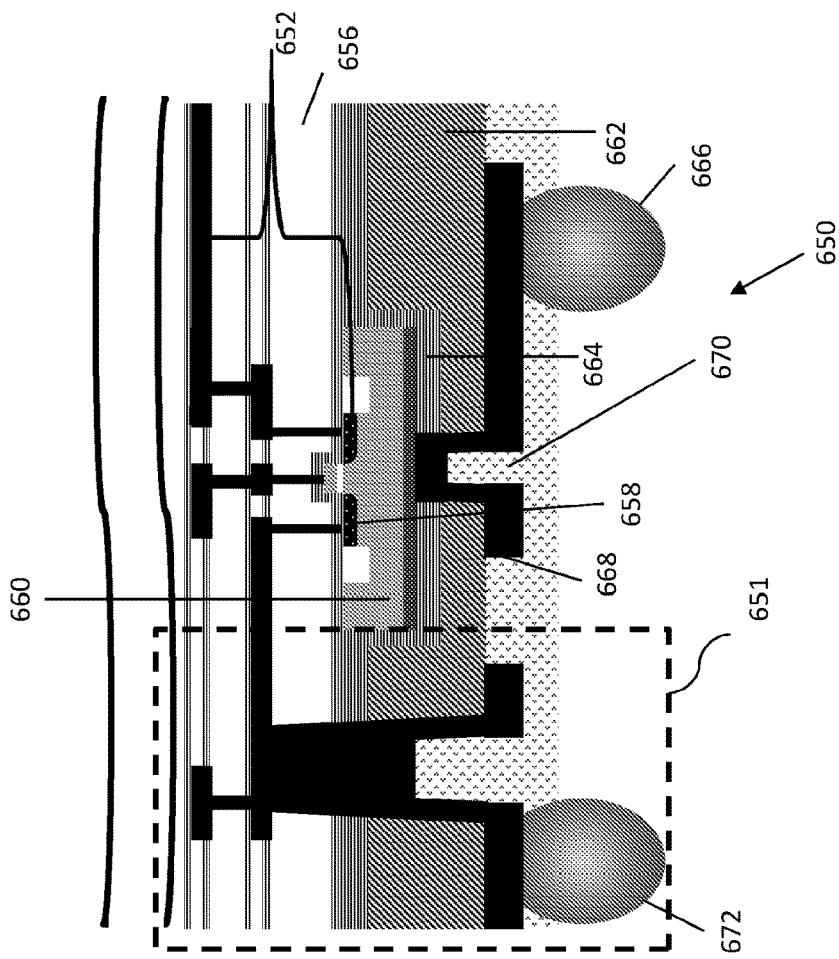
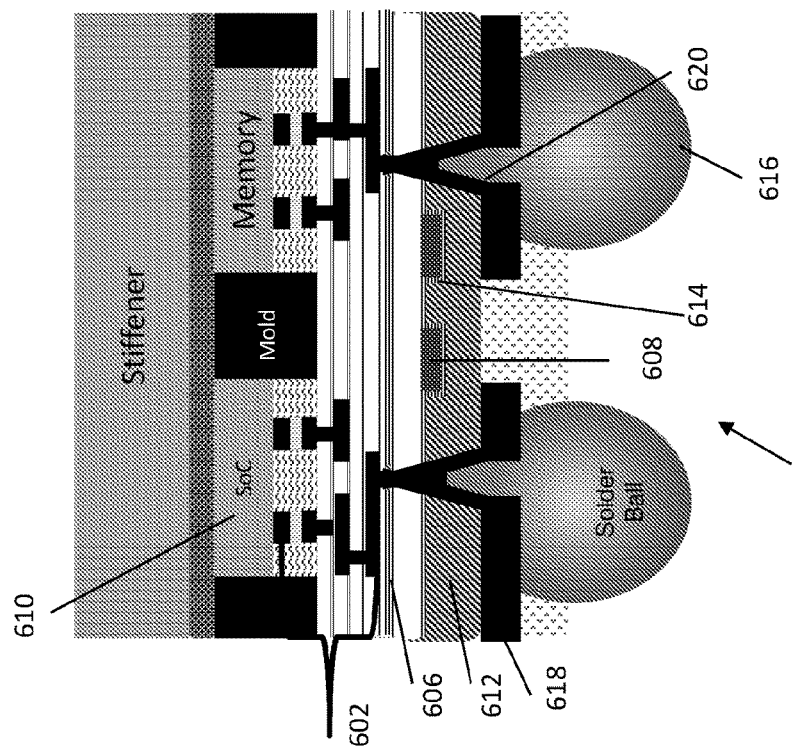
FIG. 6A
FIG. 6B

FAN-OUT WAFER-LEVEL PACKAGING METHOD AND THE PACKAGE PRODUCED THEREOF

CROSS-REFERENCE TO RELATED APPLICATIONS

This patent application is a U.S. National Phase Application under 35 U.S.C. § 371 of International Application No. PCT/SG2017/050229, filed on 27 Apr. 2017, entitled FAN-OUT WAFER-LEVEL PACKAGING METHOD AND THE PACKAGE PRODUCED THEREOF, which claims priority to Singapore patent application No. 10201603724V filed on 10 May 2016.

TECHNICAL FIELD

The present invention relates to the field of fan-out wafer-level packaging. In particular, it relates to arrangements for fan-out wafer-level packaging with Cu damascene.

BACKGROUND

The fan-out wafer-level packaging (FOWLP) technology has been developed to produce semiconductors of reduced package sizes and pad layout flexibility. The FOWLP enables external terminals distributing outside of the chip by using a thin-film fan-out redistribution layer (RDL) at a wafer level format.

There are mainly two conventional fabrication technologies in the FOWLP field. First one is "Mold-first" method. The package produced by the "Mold-first" method faces challenges including (a) the package yield is dominated by the RDL yield, (b) the Input/Output (I/O) pitch of the chip embedded therein is limited by alignment mismatching between the chip and the RDL, and (c) the RDL requires a low-cure temperature resin which may negatively affect the package reliability.

To overcome these challenges, a "RDL-first" approach was developed. The "RDL-first" approach overcomes the challenges mentioned above for the "Mold-first" method, but such "RDL-first" approach still relies on polymer dielectric base Cu interconnections for the RDL. The minimum Line/Space (L/S) dimension is restricted as high as 2 um level.

To meet with higher I/O density, a 2.5D Silicon (Si) interposer solution was developed, and relevant products have been launched in the field programmable gate array (FPGA) market. The 2.5D Si interposer solution utilises 65 nm node Cu damascene interconnects as the "RDL". The minimum L/S is 0.4 um, but there is enough room for scaling further.

FIG. 1 shows a schematic diagram of a semiconductor device 100 produced by the 2.5D packaging solution with Si interposer and Through Silicon Vias (TSVs). In the semiconductor device 100, stacked memories 20a-20d and a logic chip 30 are flip-chip bonded onto a Si interposer 10 with TSVs, which enables high density interconnection between logic and memory. However, the 2.5D Si interposer solution has a negative shortcoming: its high assembly cost. It requires TSV fabrication to achieve electrical connections between front 12 and back 13 sides of the Si interposer.

To achieve a high density interconnection like the Si interposer 100 without TSVs, a Silicon-less Interconnect Technology (SLIT) was developed. In the SLIT, the Si substrate is completely eliminated from the Si interposer, and backside interconnections can be done without any need for TSVs. Such structure would drastically reduce the fabrication cost of the TSV interposer as much as 40%.

However, in SLIT, the Si wafer is destroyed at the end of the process thereby increasing the cost of SLIT. The Si wafer cannot be recycled nor reused for any other purposes. Thus, there is large room to achieve SLIT cost reduction by utilizing Si wafer recycling and/or integrating devices into Si carriers.

Thus, what is needed is a FOWLP method that can exclude production of TSVs and can form devices integrated into the Si substrate/carrier. Furthermore, other desirable features and characteristics will become apparent from the subsequent detailed description and the appended claims, taken in conjunction with the accompanying drawings and this background of the disclosure.

SUMMARY OF THE INVENTION

In accordance with a first aspect, the present invention provides a method for fabricating a fan-out wafer-level package for one or more integrated circuit (IC) dies. The method includes providing a silicon substrate layer having a first thickness and forming one or more active/passive devices having at least sources and drains and one or more diffusion layers adjoining the sources and drains. Forming the one or more active/passive devices includes forming the sources and the drains in a front-end-of-line (FEOL) layer on a first side of the silicon substrate layer while forming the one or more diffusion layers at locations in the silicon substrate layer adjoining the sources and the drains. The method also includes forming a redistribution layer (RDL) over the FEOL layer by copper damascene formation of multiple metallization layers for connecting the one or more active/passive devices to the one or more IC dies when the one or more IC dies are mounted on a side of the RDL opposite the FEOL layer. Finally, the method includes thinning the silicon substrate layer to a second thickness to form a thinned silicon substrate, the thinned silicon substrate including at least the one or more diffusion layers, and patterning the thinned silicon substrate to form one or more silicon regions, each of the one or more silicon regions including the one or more diffusion layers.

In accordance with a second aspect, the present invention provides a fan-out wafer-level package (FO-WLP) for mounting one or more integrated circuit (IC) dies. The FO-WLP includes a redistribution layer (RDL), a front-end-of-line (FEOL) layer and one or more silicon regions. The RDL includes metallization layers for connecting the one or more IC dies to one or more active/passive devices when the one or more IC dies are mounted on a first side of the RDL. A first side of the FEOL layer adjoins a second side of the RDL and has the one or more active/passive devices partly formed therein, the second side of the RDL opposite the first side of the RDL. The one or more silicon regions are formed on a second side of the FEOL layer and one or more diffusion layers of the one or more active/passive devices are formed in the one or more silicon regions.

BRIEF DESCRIPTION OF THE DRAWINGS

Embodiments of the invention will be better understood and readily apparent to one of ordinary skilled in the art from the following written description, by way of example only, and in conjunction with the drawings, in which:

FIG. 6A shows a schematic diagram of a first embodiment of fan-out wafer-level package produced in accordance with the present fan-out wafer-level packaging method.

FIG. 6B shows a schematic diagram of a second embodiment of fan-out wafer-level package produced in accordance with the present fan-out wafer-level packaging method.

Figure 1:
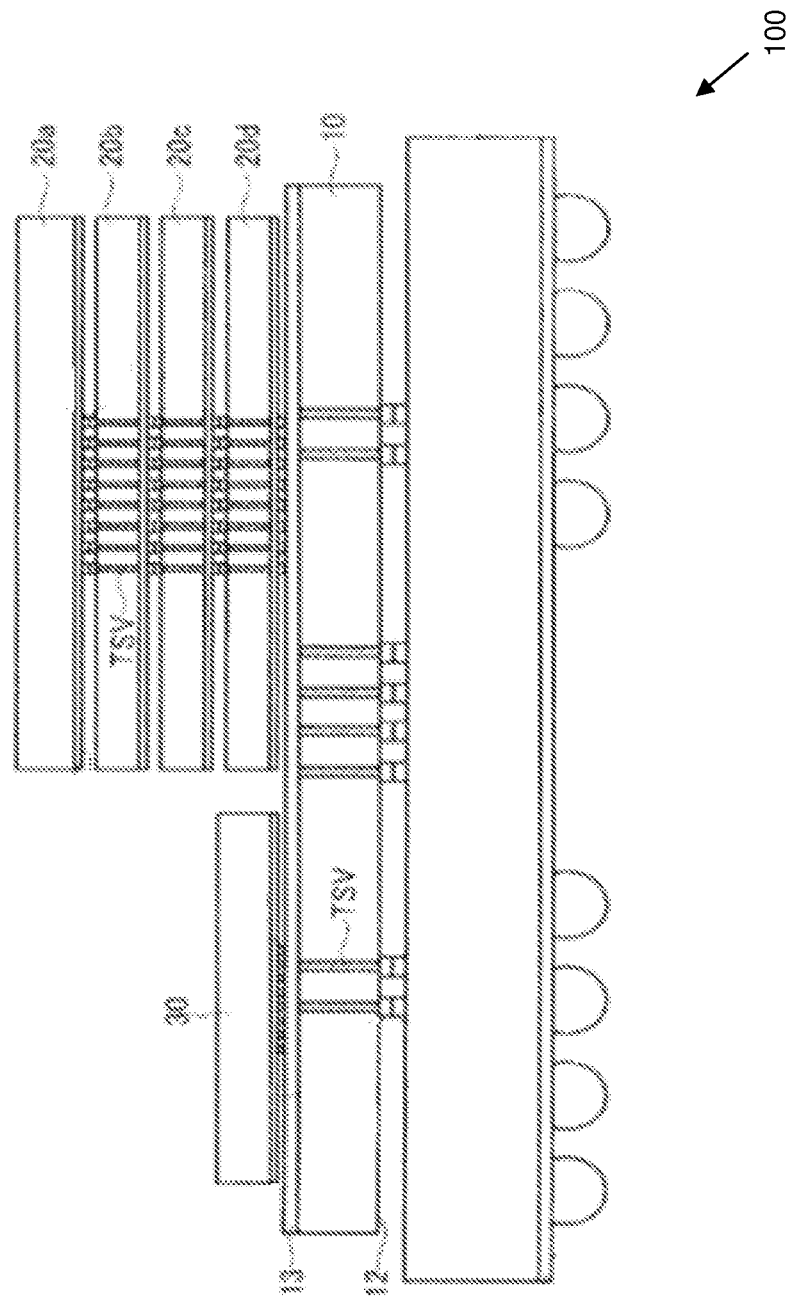
FIG. 1 shows a schematic diagram of a semiconductor device 100 produced in accordance with the 2.5D packaging solution prior art.

Skilled artisans will appreciate that elements in the figures are illustrated for simplicity and clarity and have not necessarily been depicted to scale. For example, the dimensions of some of the elements in the illustrations, block diagrams or flowcharts may be exaggerated in respect to other elements to help to improve understanding of the present embodiments.

DETAILED DESCRIPTION

Embodiments of the present invention will be described, by way of example only, with reference to the drawings. Like reference numerals and characters in the drawings refer to like elements or equivalents. Skilled artisans will appreciate that an aspect or an advantage described in conjunction with a particular embodiment is not necessarily limited to that embodiment and can be practiced in any other embodiments even if not so illustrated.

In the present disclosure, one or more active/passive devices are devices formed during Front End Of Line processing of a fan-out wafer-level package and include active devices and/or passive devices for package functions (e.g. electrostatic discharge protection).

In the present disclosure, a Front End Of Line (FEOL) layer includes the one or more active/passive devices (which includes diffusion layers for sources and drains of the active/passive devices formed in portions of the silicon substrate directly adjoining the sources and drains), and at least one shallow trench isolation (STI) regions which is fabricated in the silicon substrate by Si etching, SiO2 filling and chemical-mechanical polishing (CMP) the STI area of the silicon substrate. The FEOL layer may also include the following which are fabricated on the silicon substrate and within the FEOL layer: at least one gate oxide, at least one gate poly-Si, one or more SiN/SiO2 dielectric layers, and one or more W-plugs to connect a subsequently formed redistribution layer (RDL) to the active/passive devices.

Figure 2:
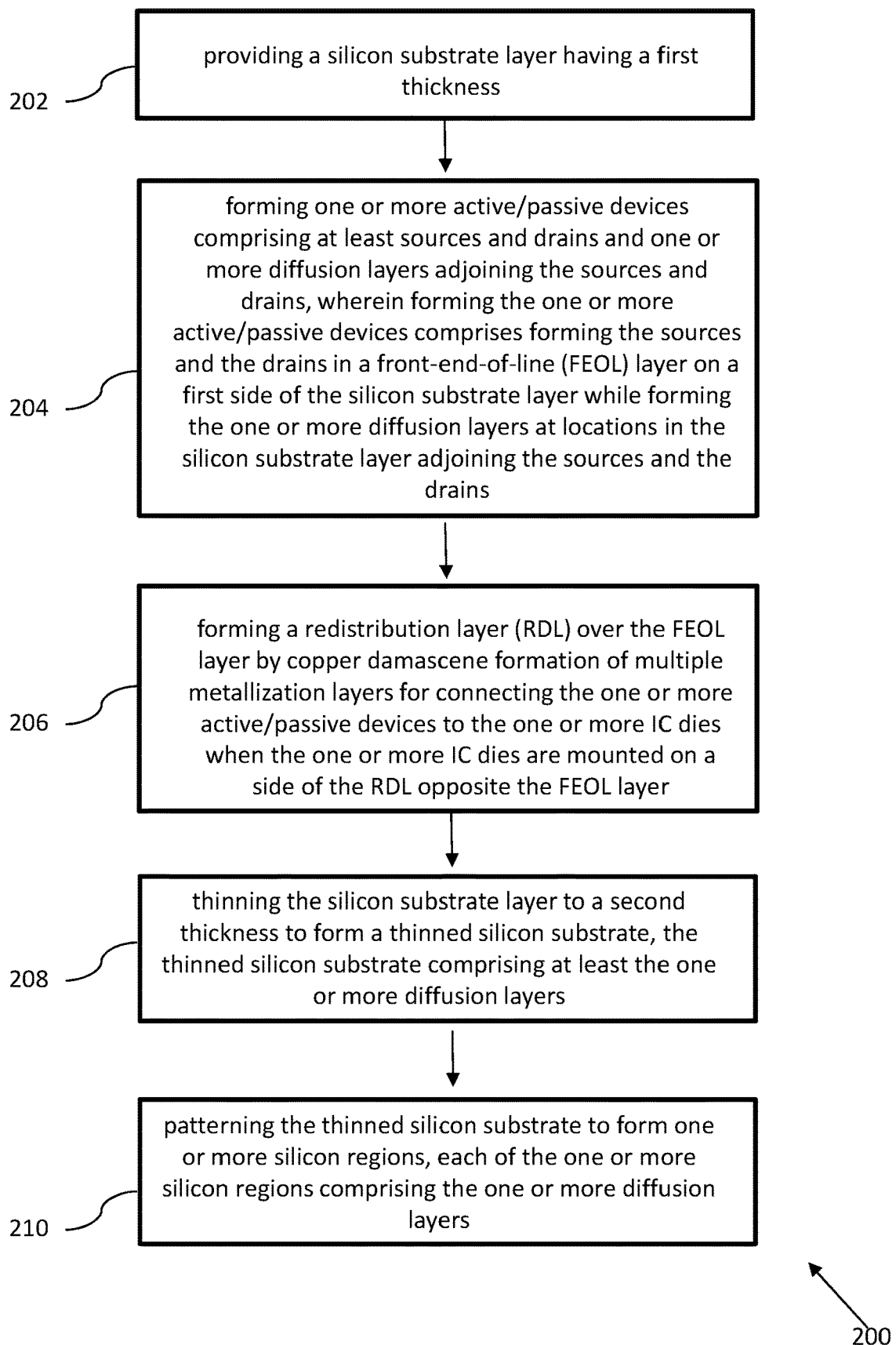
FIG. 2 shows a flowchart depicting steps of a method for fabricating a fan-out wafer-level package for one or more integrated circuit (IC) dies in accordance with embodiments of the invention.

FIG. 2 shows a flowchart depicting steps of a method 200 for fabricating a fan-out wafer-level package for one or more integrated circuit (IC) dies in accordance with embodiments of the invention.

The method 200 broadly includes:
step 202: providing a silicon substrate layer having a first thickness.
step 204: forming one or more active/passive devices comprising at least sources and drains and one or more diffusion layers adjoining the sources and drains, wherein forming the one or more active/passive devices comprises forming the sources and the drains in a front-end-of-line (FEOL) layer on a first side of the silicon substrate layer while forming the one or more diffusion layers at locations in the silicon substrate layer adjoining the sources and the drains.
step 206: forming a redistribution layer (RDL) over the FEOL layer by copper damascene formation of multiple metallization layers for connecting the one or more active/passive devices to the one or more IC dies when the one or more IC dies are mounted on a side of the RDL opposite the FEOL layer.
step 208: thinning the silicon substrate layer to a second thickness to form a thinned silicon substrate, the thinned silicon substrate comprising at least the one or more diffusion layers.
step 210: patterning the thinned silicon substrate to form one or more silicon regions, each of the one or more silicon regions comprising the one or more diffusion layers.

In step 202, a silicon substrate layer having a first thickness is provided for fabricating a fan-out wafer-level package for one or more integrated circuit (IC) dies. In the present application, the fan-out wafer-level package is configured to support the one or more IC dies mounted therein. The one or more IC dies may include single die or 3D stacked dice. Further, the one or more IC dies include one or more system-on-a-chip (SoC), memory, etc. The SoC may include a graphics processing unit (GPU), a memory, a universal serial bus (USB) controller, power management circuits, and wireless radios such as Wi-Fi, 3G, 4G LTE, etc.

In step 204, one or more active/passive devices is formed on a first side of the silicon substrate layer. The one or more active/passive devices include at least sources and drains and one or more diffusion layers adjoining the sources and drains that can be formed in a front-end-of-line (FEOL) process. The FEOL process can include forming the sources and the drains in a front-end-of-line (FEOL) layer on the first side of the silicon substrate layer while forming the one or more diffusion layers at locations in the silicon substrate layer adjoining the sources and the drains.

In this step, the one or more active/passive devices formed on the first side of the silicon substrate layer may include semiconductor devices for providing functioning to the one or more IC dies mounted in the fan-out wafer-level package.

The one or more passive devices may include resistors, capacitors, inductors, transformers, etc. In an embodiment, the one or more passive devices may include one or more Metal-Oxide-Semiconductor (MOS) capacitors that can be used as decoupling capacitors for the one or more IC dies. Compared with any conventional on-package decoupling capacitors, the MOS capacitors formed in the FEOL layer during step 204 advantageously provide better performance with minimum equivalent series resistance (ESR) and equivalent series inductance (ESL). This is because the MOS capacitors formed in the FEOL layer during step 204 can be directly connected to power supplies of one or more IC nearby with a shortest trace. Further, the MOS capacitors formed in the FEOL layer during step 204 have higher unit capacitance density than that of a metal-insulator-metal (MIM) capacitor. Although the MIM capacitor using high-K dielectric can achieve higher unit capacitance density, it requires additional fabrication process while the MOS capacitor is formed in the FEOL process conducted in step 204.

The one or more active devices may include one or more transistors and/or diodes. In an embodiment, the one or more active devices may include one or more electrostatic discharge (ESD) circuits. The ESD circuits can provide electrostatic discharge (ESD) protection for the one or more IC dies in the fan-out wafer-level package. Alternative, the ESD circuits can be fabricated in other processes and be built into the FEOL layer in the silicon substrate layer during step 204. To increase a surface area for discharging ESD current, backside connection on one or more silicon regions, which will be described in the following description, can be utilized.

The step 204 of forming the one or more active/passive devices may further include forming one or more shallow trench isolation (STI) regions in the silicon substrate layer in a manner that in case the silicon substrate layer may be subsequently thinned, the one or more STI regions remain in a thinned silicon substrate.

In step 206, a redistribution layer (RDL) is formed over the FEOL layer. In an embodiment, the RDL includes a plurality of metallization layers fabricated by copper damascene formation, such that when the one or more IC dies are mounted on a side of the RDL that is opposite the FEOL layer, the multiple metallization layers in the RDL may provide conductive connections for connecting the one or more active/passive devices to the one or more IC dies.

The plurality of metallization layers may include at least a bottom most layer comprising a plurality of metal segments. Each of the plurality of metal segments is formed between a first (e.g. top) surface and a second (e.g. bottom) surface of the bottom most layer. The metal segments are separated by a dielectric material in the bottom most layer. Details of the formation of the metallization layers will be described with regard to FIG. 3.

In step 208, the silicon substrate layer is thinned to a second thickness to form a thinned silicon substrate. The step 208 of thinning the silicon substrate layer may include back grinding or cleaving the silicon substrate layer.

The thinned silicon substrate includes at least the one or more diffusion layers of the one or more active/passive devices. The thinned silicon substrate may further include the one or more STI regions.

In step 210, the thinned silicon substrate is patterned to form one or more silicon regions. In an embodiment, the step 210 of patterning the thinned silicon substrate includes etching the thinned silicon substrate to form the one or more silicon regions. Each of the one or more silicon regions includes the one or more diffusion layers of the one or more active/passive devices. The one or more silicon regions formed in the patterned thinned silicon substrate in step 210 may further include the one or more STI regions.

To enhance backside conductive connection to the one or more silicon regions, the thinning step 208 may further include depositing one or more metal layers over the thinned silicon substrate layer.

In an embodiment of the method 200, the steps 202, 204 and 206 can be considered as a first side fabrication process to form the first side of a fan-out wafer-level package; the steps 208 and 210 can be considered as a second side fabrication process to form the first side of a fan-out wafer-level package. Between the step 206 and the step 8, there may be a step of turning over the fan-out wafer-level package to facilitate performing the steps of the second side fabrication process. The second side of the fan-out wafer-level package can be connected to external electronics outside the fan-out wafer-level package so that the IC dies mounted in the fan-out wafer-level package can be connected to the external electronics through the RDL fabricated in the first side fabrication. Embodiments of the first side fabrication process and the second side fabrication process are described with regard to FIGS. 3 to 5.

After the step 210, the second side fabrication process of the method 200 may further include depositing a SiN layer over the one or more silicon regions and the FEOL layer, to serve as a diffusion barrier layer to prevent metal contamination of the one or more silicon regions during subsequent processing. The SiN layer can be deposited by a chemical vapor deposition (CVD) process.

In an embodiment, the second side fabrication process of the method 200 may further include depositing a nonconductive material over the diffusion barrier layer to form a buffer layer. One or more conductive contacts will then be formed through the buffer layer, the diffusion layer and the FEOL layer to connect to connections in the RDL provided by the plurality of metallization layers. In this embodiment, the one or more conductive contacts are formed through areas of the buffer layer, the diffusion barrier layer and the FEOL layer that do not include the one or more active/passive devices nor the one or more diffusion layers of the one or more active/passive devices.

In this embodiment, the step of forming the one or more conductive contacts may include forming one or more openings through the buffer layer, the diffusion barrier layer and the FEOL layer; and depositing conductive material at least onto sides of the one or more openings.

In an alternative embodiment, the second side fabrication process of the method 200 may further include depositing a nonconductive material over the diffusion barrier layer to form a buffer layer; and forming a plurality of conductive contacts through the buffer layer, the diffusion barrier layer and the FEOL layer.

In the alternative embodiment, the step of forming the plurality of conductive contacts may include forming a first set of one or more contact openings through the buffer layer, the diffusion barrier layer and the FEOL layer to connect to connections in the RDL; forming a second set of one or more contacts openings through the buffer layer and the diffusion barrier layer to connect to a backside of at least one of the one or more active/passive devices; and depositing conductive material at least onto sides of the first and second sets of one or more contact openings.

In the above embodiments, the method 200 may further include a step of mounting one or more IC dies onto a first side of the RDL. The first side of the RDL is distal to the bottom most layer of the metallization layers of the RDL. The first side of the RDL may include a top most layer of the metallization layers that is in conductive connection with the bottom most layer and intermediate layers of the metallization layers.

The mounting may include micro-bumping and/or chip-to-wafer (C2 W) bonding. In this manner, opposite the first side of the RDL, a second side of the RDL adjoins a first side of the FEOL layer that has the one or more active/passive devices partly formed therein. The one or more silicon regions are formed on a second side of the FEOL layer and one or more diffusion layers of the one or more active/passive devices are formed in the one or more silicon regions.

The step of mounting the one or more IC dies onto a first side of the RDL may be performed between the step 206 and the step 208. That is, after the RDL is formed and before the silicone substrate layer is thinned. Alternatively, the step of mounting the one or more IC dies onto the first side of the RDL may be performed at any step that is deemed appropriate in accordance with the fabrication conditions.

The method 200 may further include a step of encapsulating the one or more IC dies by overmolding with resin after the one or more IC dies are mounted on the first side of the RDL, i.e. the side of RDL that is opposite the FEOL layer.

After the one or more IC dies are mounted on the side of the RDL opposite the FEOL layer and encapsulated by resin, the method 100 may further include a step of attaching a stiffener plate onto the one or more IC dies. The stiffener plate is preferably made of silicon from package warpage point of view, but it can also be made from materials that are selected from Cu, AlSiC etc.

As the above described method 200 is performed on a wafer, the wafer then can be singulated into individual die-form to obtain the fan-out wafer-level package as shown in FIGS. 6A and 6B. The fan-out wafer-level package obtained through the above steps can be treated as a single die, and will be bonded on to an organic substrate by flip-chip bonding. As described above, the each die for the SoC or the memory can be a single die or 3D stacked dice. The 3D stacking can be performed in the aforementioned C2 W bonding step when mounting IC dies onto the first side of the RDL. Advantageously, in the present application, as the C2 W bonding can be conducted on rigid structure consist of metal patterns with inorganic inter-metal dielectric on thick silicon substrate, fine-pitch bonding can be easily achieved with a bump pitch of 10 um or finer.

Figure 3:
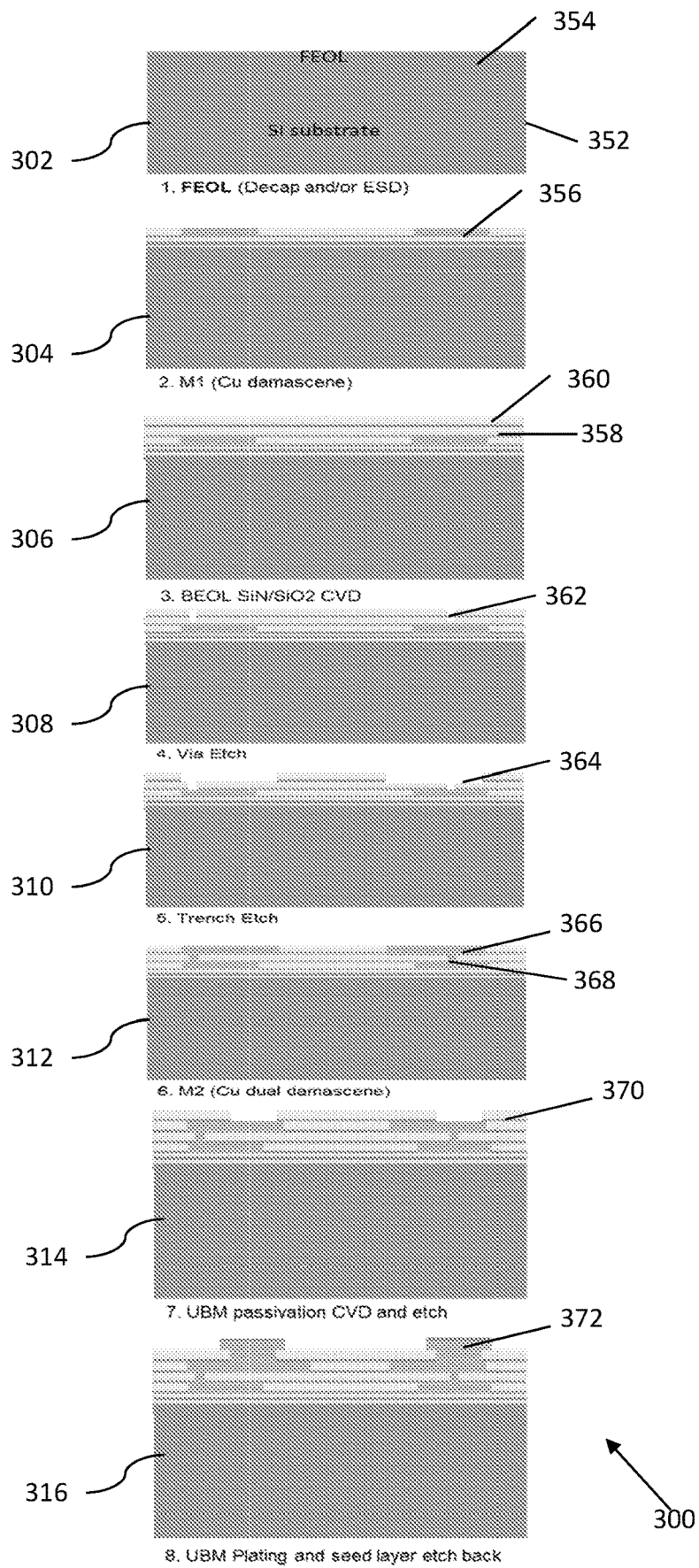
FIG. 3 shows a block diagram of a first side fabrication of the present fan-out wafer-level packaging method in accordance with a first embodiment of the fan-out wafer-level packaging method.

FIG. 3 is a process flow 300 of an embodiment of the first side fabrication process of the present fan-out wafer-level packaging method 200.

In the embodiment shown in FIG. 3, the first side fabrication fabricates a front side of a fan-out wafer-level package. Alternatively, it can be appreciated by those skilled in the art that the first side fabrication may be used to fabricate a back side of certain fan-out wafer-level packages.

As shown in FIG. 3, step 302 depicts an embodiment of the step 204 of forming one or more active/passive devices by a front-end of line (FEOL) process. As described above, the active/passive devices can be decoupling capacitors and/or electrostatic discharge (ESD) circuits. It can be seen that a silicon substrate layer 352 with a first thickness is provided in this step in order to forming the active/passive devices. During the step 204, a front-end of line (FEOL) layer 354 is formed with at least part of the active/passive devices, such as sources and drains. Part of the active/passive devices, such as one or more diffusion layers and/or shallow trench isolation (STI) regions, can be formed in the silicon substrate layer 352 adjoining the sources and drains in the FEOL layer 354.

Steps 304, 306, 308, 310 and 312 depict an embodiment of the step 206 of forming a RDL over the FEOL layer. In step 304, a first metallization layer 356 is formed by a copper (Cu) damascene process. In step 306, a SiN layer 358 and a SiO2 layer 360 are formed on the first metallization layer 356 by a chemical vapor deposition (CVD) process. In step 308, one or more vias/holes 362 are formed by an etching process. The etching process can be a dry etching process.

The one or more vias/holes 362 are formed through the SiN layer 358 and the SiO2 layer 360 to expose one or more portions/segments of the first metallization layer 356. In step 310, one or more trenches 364 are formed in the SiO2 layer 360 and/or the SiN layer 358 so that the vias 306 formed in the SiO2 layer 360 is enlarged to one or more trenches 364. The one or more trenches 364 are formed by an etching process. In step 312, a damascene process is conducted onto the one or more trenches 364 and the one or more vias/holes 362. In this manner, a second metallization layer 366 is formed in the SiO2 layer with metallization interconnections 368 in the SiN layer 358. Steps 306, 308, 310 and 312 can be repeated to form further interconnect layers, where necessary.

The first side fabrication process 300 may further includes steps 314 and 316. Step 314 depicts a step that forms a passivation layer by a chemical vapor deposition (CVD) process and etches the passivation layer (i.e. CVD layer) for forming one or more under bump metallization (UBM).

In step 316, one or more under bump metallization (UBM) are formed in the etched portions of the passivation layer. The one or more UBM may be formed by an electroplating process. The portions of the passivation layer that are not etched in step 314 may then be removed in step 316 in a seed etching process. The one or more UBM can be used for mounting the one or more IC dies.

By the above process, active/passive devices as well as back-end of line (BEOL) Cu damascene multilayer interconnects 356, 366, 368, and UBM 372 are formed on the front side of the silicon substrate. The multilayer interconnects 356, 366, 368 include a plurality of metallization layers 356, 366, 368 fabricated by Cu damascene process. The metallization layer 356 formed in step 304 can be considered as a bottom most layer 356 of the metallization layers 356, 366, 368. The bottom most layer 356 includes a plurality of metal segments, each of the plurality of metal segments is formed between a top surface and a bottom surface of the bottom most layer 356.

Figure 4:
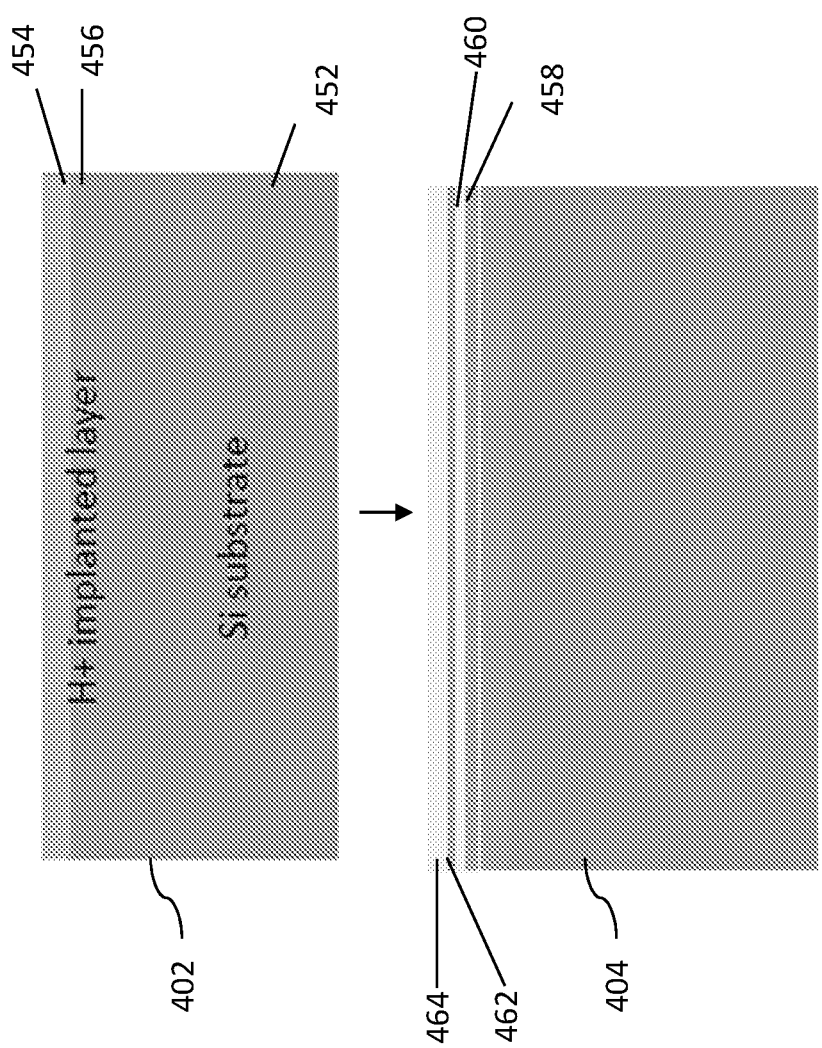
FIG. 4 shows a flow chart depicting a step 402 that can be an embodiment of step 302 as shown in FIG. 3 and a step 404 that can be a step conducted between step 302 and step 304.

FIG. 4 shows a flow chart depicting a step 402 that can be an embodiment of step 302 as shown in FIG. 3 and a step 404 that can be a step conducted between step 302 and step 304.

As shown in step 402, part of the active/passive devices formed in step 302 may be fabricated by depositing a SiO2 layer 456 over the silicon substrate layer 452 and implanting the SiO2 layer 456 with H$^+$ ions, such that a H$^+$ implanted layer 456 is formed in the silicon substrate layer 452. In this manner, the H$^+$ implanted layer 456 is formed in the silicon substrate layer 452 adjoining the FEOL layer 454. The part of the active/passive devices formed in step 402 may include the one or more diffusional layers and/or STI regions.

The step 402 can be a step separate from or incorporated into the step of forming the FEOL layer 454. Preferably, the step 402 is performed before forming the FEOL layer 454 so that the FEOL layer 454 can be formed directly over the H$^+$ implanted layer 456 in the silicon substrate layer 452.

In step 404, a passivation layer 458 can be deposited onto the FEOL layer 454 by a SiN deposition process. Subsequently a TEOS layer 460, a SiN layer 462 and a TEOS layer 464 can be further deposited over the passivation layer 458.

After the front-side fabrication process in FIG. 3, chip-to-wafer (C2 W) bonding of one or more of the IC dies on a surface of the top most layer 372 of the metallization layers may follow for electrical interconnections. Then, the IC dies can be encapsulated at a wafer-level on the top surface of the silicon substrate, more specifically on the top most layer 372 of the metallization layers of the RDL. The encapsulated IC dies in the silicon substrate may be overmolded with resin, backgrinded on the overmolded portion, and then attached with a stiffener. Such a structure may be turned over to facilitate subsequent process, as shown in the embodiment of FIG. 5 for a second side fabrication process.

Figure 5:
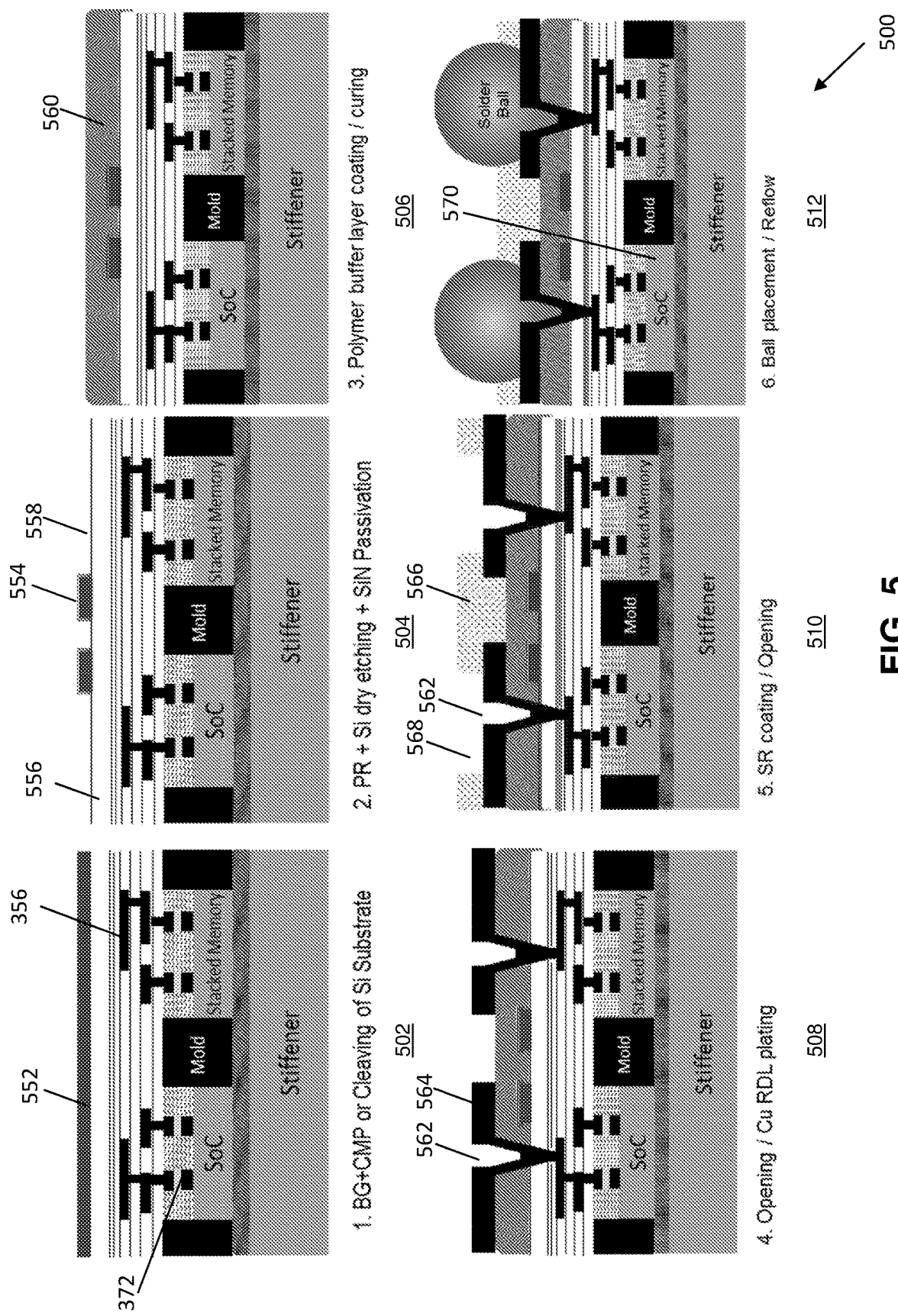
FIG. 5 shows a block diagram of a second side fabrication of the present fan-out wafer-level packaging method in accordance with the first embodiment of the fan-out wafer-level packaging method.

FIG. 5 is a process flow 500 of an embodiment of the second side fabrication process of the present fan-out wafer-level packaging method 200.

In the embodiment shown in FIG. 5, the second side fabrication 500 fabricates a back side of a fan-out wafer-level package. Alternatively, it can be appreciated by those skilled in the art that the second side fabrication may be used to fabricate a front side of certain fan-out wafer-level packages.

As shown in FIG. 5, step 502 depicts an embodiment of the step 208 of thinning the silicon substrate layer 552 to a second thickness to form a thinned silicon substrate 552. The thinning step may include back grinding or cleaving the silicon substrate layer 552, followed by polishing. In this step, the active/passive devices formed area remains in the thinned silicon substrate 552. The silicon is completely removed at other areas of the silicon substrate layer 552 where the active/passive devices are not formed to enable electrical contact to the first metallization layer 356 from backside without formation of TSVs. In an embodiment, the thinned silicon substrate 552 includes at least the one or more diffusion layers of the one or more active/passive devices.

Step 504 depicts an embodiment of the step 210 of patterning the thinned silicon substrate 552 to form one or more silicon regions 554. Each of the one or more silicon regions 554 includes the one or more diffusion layers of the active/passive devices. In an embodiment, the one or more silicon regions 554 may be portions of the H+ implanted layer 456 as depicted in FIG. 4. The step of patterning may include photoresist (PR) coating the thinned silicon substrate 552 and patterning the PR coated thinned silicon substrate 552, followed by dry etching the PR coated thinned silicon substrate 552 to form the one or more silicon regions 554 and expose portions of the FEOL layer 556, and depositing a SiN passivation layer 558 over the portions of the FEOL layer 556 and the one or more silicon regions 554 as a diffusion barrier layer 558 to prevent metal contamination of the one or more silicon regions during subsequent processing.

The second side fabrication process 500 may further include steps 506, 508, 510 and 512. In step 506, a layer of nonconductive material, e.g. a polymer buffer layer 560, is coated over the SiN passivation layer 558 and may be further cured by laser for solidification. In step 508, one or more contact openings 562 and backside RDL (BS-RDL) 564 are formed through the polymer buffer layer 560, the diffusion barrier layer 558 and the FEOL layer 556 to connect to the bottom most layer 356 of the metallization layers. In this manner, the backside RDL (BS-RDL) 564 provides conductive contacts through the polymer buffer layer 560, the diffusion barrier layer 558 and the FEOL layer 556 to connect to connections in the RDL. The one or more conductive contacts are formed through areas of the polymer buffer layer 560, the diffusion barrier layer 558 and the FEOL layer 556 that do not include the one or more active/passive devices nor the one or more diffusion layers of the one or more active/passive devices.

In step 510, a solder resist (SR) coating layer 566 is deposited over the backside RDL 564 that is deposited on polymer buffer layer 560 and portions of the polymer buffer layer 560, but not over the one or more contact openings 562. In step 510, one or more portions 568 of the solder resist (SR) coating deposited on a portion of the backside RDL 564 over the polymer buffer layer 560 that is adjacent the one or more contact openings 562 can be etched, such that the one or more contact openings 562 are enlarged to facilitate depositing conductive material onto the one or more contact openings 562 in step 512.

In step 512, the conductive material, such as one or more solder balls, is deposited onto at least sides of the one or more contact openings 562. In the embodiment of step 512 shown in FIG. 512, the conductive material is further deposited into the contact openings 562. By virtue of the step 512, the conductive connection for the one or more IC dies 570 encapsulated in the fan-out wafer-level package can be reflowed through the RDL to external electronics outside the fan-out wafer-level package.

As described above, as the above described steps are performed on a wafer, the wafer then can be singulated into individual die-form to achieve the fan-out wafer-level package as shown in FIGS. 6A and 6B. The fan-out wafer-level package obtained through the above steps can be treated as a single die, and will be bonded on to an organic substrate by flip-chip bonding. As described above, the each die for the SoC or the memory can be a single die or 3D stacked dice. The 3D stacking can be performed in the aforementioned C2 W bonding step when mounting IC dies onto the first side of the RDL. Advantageously, in the present application, as the C2 W bonding can be conducted on rigid structure consist of metal patterns with inorganic inter-metal dielectric on thick silicon substrate, fine-pitch bonding can be easily achieved with a bump pitch of 10 um or finer.

FIG. 6A shows a first embodiment 600 of the fan-out wafer-level package fabricated in accordance with the present method 200. In the first embodiment 600, the fan-out wafer-level package for mounting one or more integrated circuit (IC) dies thereon includes a redistribution layer (RDL) 602, a front-end-of-line (FEOL) layer 606 and one or more silicon regions 608.

In the embodiment 600, the redistribution layer (RDL) 602 includes a plurality of metallization layers for connecting the one or more IC dies 610 to one or more active/passive devices when the one or more IC dies 610 are mounted on a first side of the RDL 602.

In the FEOL layer 606, a first side of the FEOL layer 606 adjoins a second side of the RDL 602 and has the one or more active/passive devices partly formed therein. The second side of the RDL 602 is opposite the first side of the RDL 602.

The one or more silicon regions 608 are formed on a second side of the FEOL layer 606, wherein one or more diffusion layers of the one or more active/passive devices are formed in the one or more silicon regions 608.

In the embodiment 600, the fan-out wafer-level package may further include a nonconductive material layer 612 formed over the one or more silicon regions 608 and the second side of the FEOL layer 606. The fan-out wafer-level package may further include a diffusion barrier layer 614 formed over the second side of the FEOL layer 606 and the one or more silicon regions 608 and below the nonconductive material layer 612.

In the embodiment 600, the fan-out wafer-level package may further include a first set 616 of one or more conductive contacts formed through the nonconductive material layer 612 and the FEOL layer 606 to connect to connections in the RDL 602. The first set 616 of one or more conductive contacts pass through the FEOL layer 606 at locations other than where the one or more active/passive devices are formed. In this embodiment, the first set 616 of one or more conductive contacts includes at least a conductive layer 618 formed along sides of one or more openings 620 formed through the nonconductive material layer 612 and the FEOL layer 606 to provide connection from the RDL 602 to outside the fan-out wafer-level package. The first set 616 of one or more conductive contacts are formed through areas of the nonconductive material layer 612 and the FEOL layer 606 that do not include the one or more active/passive devices.

Advantageously, in the present fan-out wafer-level package, semiconductor devices, i.e. the active/passive devices can be formed within and inherently integrated in the fan-out wafer-level package. If the semiconductor devices are active devices, any metal contamination which degrades device performance need to be carefully avoided. One solution to this is by implementing guard rings around the active devices to prevent metal diffusion from sides during the FEOL process. Passive devices are more preferable for this application, as passive devices are less sensitive to metal contamination.

In the first embodiment 600, the IC dies may be embedded in a mold compound. It can be appreciated by those skilled in the art that any number and any type of IC dies 610 can be encapsulated in present fan-out wafer-level package, not limited to the example as shown. In the first embodiment 600, multi-layers of Cu damascene interconnects are fabricated to make electrical connections between the IC dies and to the backside RDL for off-package connections. In the first embodiment 600, the one or more silicon regions 608 comprising the active/passive devices patterned from the thinned silicon substrate are located vertically on top of the functional IC dies 610 (i.e. SoC and memory in the first embodiment 600) encapsulated in the mold compound. Significant package area reduction is advantageously achieved as the one or more silicon regions 608 do not need to be placed side-by-side with the functional IC dies.

Furthermore, the length of interconnect between the functional IC dies 610 and one or more silicon regions 608 is advantageously dramatically shortened, when compared with the conventional side-by-side die placement. The vertical interconnects through several Cu damascene formed metallization layers are just few microns while the side-by-side interconnect between dies is at least few hundreds microns (sometimes may even go up to several millimeters, depending on the functional die pad arrangement).

Similar to FIG. 6A, FIG. 6B shows a second embodiment 650 of the fan-out wafer-level package fabricated in accordance with the present method. In the second embodiment 650 of the fan-out wafer-level package, only RDL 652, active/passive devices 658 and backside structure of fan-out wafer-level package are illustrated, for the sake of clarity. In this embodiment, backside metal is deposited after silicon substrate layer thinning and polishing to enable backside contact during the BS-RDL process. The metal can be selected from Ti, TiN, Al, W, and other conductive materials. When ESD circuits are fabricated in the Si layers, the backside contacts act as effective discharge pass.

In the second embodiment 650, the reference numbers 652, 656, 658, 660, 662, 664, 666, 668 and 670 correspond to the components 602, 606, 608, 612, 614, 616, 618 and 620 of FIG. 6A, respectively.

In the second embodiment 650, the fan-out wafer-level package further includes a second set 672 of one or more conductive contacts formed through the nonconductive material layer 662 to provide connection from a backside of at least one of the one or more active/passive devices 658 to outside the fan-out wafer-level package.

Figure 7:
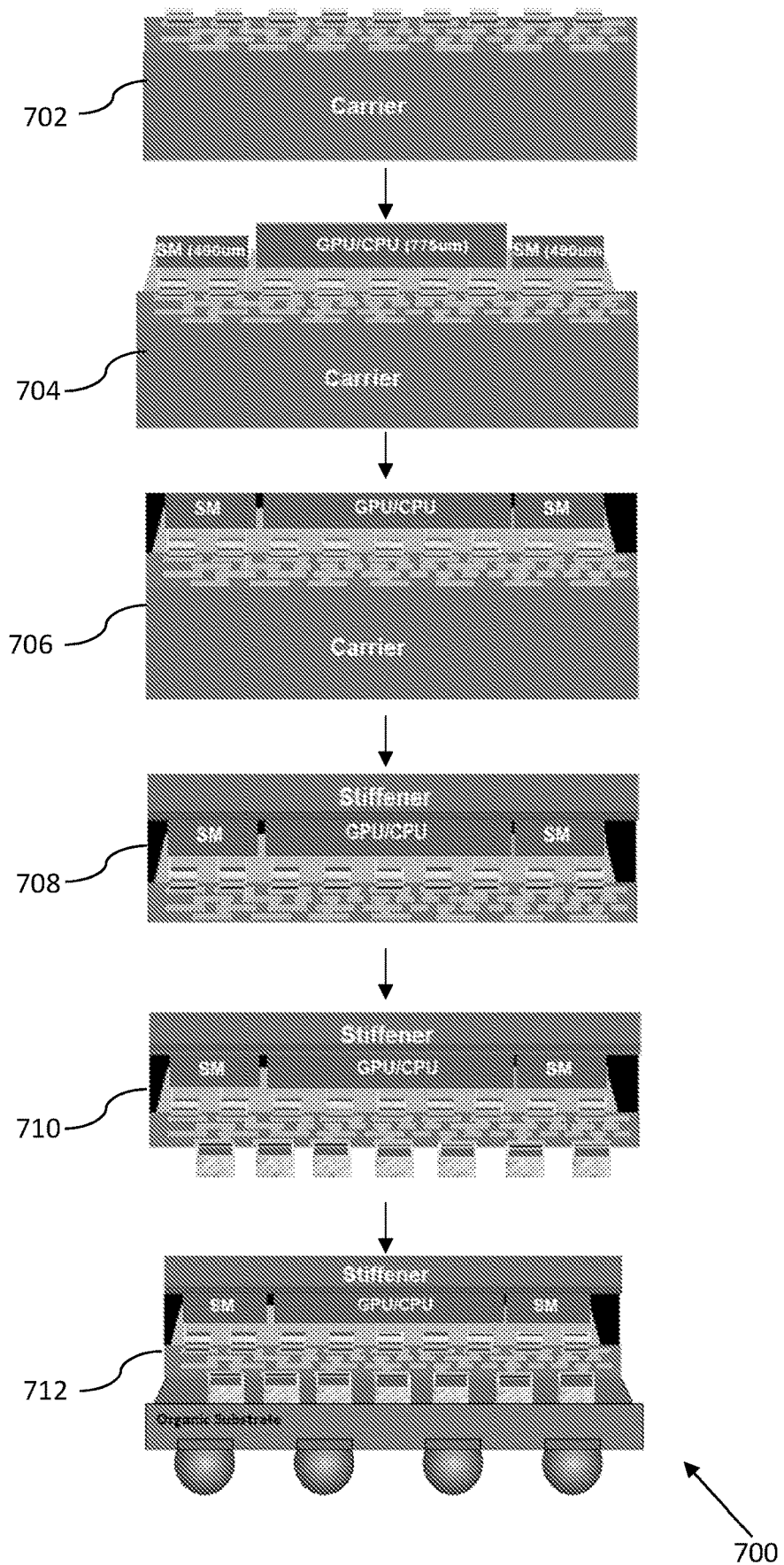
FIG. 7 shows a block diagram depicting an alternative method for fabricating a fan-out wafer-level package for one or more integrated circuit (IC) dies in accordance with the present invention.

FIG. 7 shows a block diagram depicting an alternative method for fabricating a fan-out wafer-level package with one or more integrated circuit (IC) dies mounted therein. In the embodiment shown in FIG. 7, the fan-out wafer-level package does not include one or more active/passive devices.

In step 702, a multilayer (3L M) Cu routing (0.4 um L/S), i.e. a RDL, is fabricated using Dual-Damascene followed by micro-bump on a silicon carrier. In step 704, one or more IC dies are mounted onto the multilayer Cu routing by a chip to wafer bonding process. In the embodiment, the one or more IC dies may include a GPU, a CPU, and/or staked memories. Subsequently, an underfilling process pay be conducted to apply a polymer or liquid into the space between the one or more IC dies and the multilayer Cu routing. In this manner, the polymer or liquid underfill encapsulates the one or more IC dies. In step 706, a side of the one or more IC dies distal to the multilayer Cu routing is overmolded and grinded. In step 708, a stiffener is attached to the grinded side of the one or more IC dies using a layer of adhesive. The silicon carrier may be subsequently removed. In step 710, a passivation layer may be deposited onto a side of the multilayer Cu routing that is distal to the one or more IC dies. Portions of the passivation layer may then be removed to form one or more openings. UBM may then be formed onto the remaining portions of the passivation layer. In step 712, the wafer may be diced and attached to an organic substrate, followed with a underfill process.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects illustrative and not restrictive.

What is claimed is:

1. A method for fabricating a fan-out wafer-level package for one or more integrated circuit (IC) dies, the method comprising:

providing a silicon substrate layer having a first thickness;

forming one or more active devices comprising at least sources and drains and one or more diffusion layers adjoining the sources and drains, wherein forming the one or more active devices comprises forming the sources and the drains in a front-end-of-line (FEOL) layer on a first side of the silicon substrate layer while forming the one or more diffusion layers at locations in the silicon substrate layer adjoining the sources and the drains;

forming a redistribution layer (RDL) over the FEOL layer by copper damascene formation of multiple metallization layers for connecting the one or more active devices to the one or more IC dies when the one or more IC dies are mounted on a side of the RDL opposite the FEOL layer;

thinning the silicon substrate layer to a second thickness to form a thinned silicon substrate, the thinned silicon substrate comprising at least the one or more diffusion layers; and patterning the thinned silicon substrate to form one or more silicon regions, each of the one or more silicon regions comprising the one or more diffusion layers.

2. The method of claim 1, wherein forming the one or more active devices further comprises forming one or more shallow trench isolation (STI) regions in the silicon substrate layer, and wherein the thinned silicon substrate further comprises the one or more STI regions, the patterning step comprising patterning the thinned silicon substrate to form the one or more silicon regions, the one or more silicon regions comprising the one or more diffusion layers and the one or more STI regions.

3. The method of claim 1, wherein thinning the silicon substrate layer comprises backgrinding or cleaving the silicon substrate layer.

4. The method of claim 1, wherein patterning the thinned silicon substrate comprises etching the thinned silicon substrate to form the one or more silicon regions.

5. The method of claim 1, further comprising:
after the patterning step, depositing a SiN chemical vapor deposition layer over the one or more silicon regions and the FEOL layer as a diffusion barrier layer to prevent metal contamination of the one or more silicon regions during subsequent processing.

6. The method of claim 5, further comprising:
depositing a nonconductive material over the diffusion barrier layer to form a buffer layer; and
forming one or more conductive contacts through the buffer layer, the diffusion barrier layer and the FEOL layer to connect to connections in the RDL, the one or more conductive contacts formed through areas of the buffer layer, the diffusion barrier layer and the FEOL layer that do not comprise the one or more active devices nor the one or more diffusion layers of the one or more active devices.

7. The method of claim 6, wherein forming the one or more conductive contacts comprises: forming one or more openings through the buffer layer, the diffusion barrier layer and the FEOL layer; and
depositing conductive material at least onto sides of the one or more openings.

8. The method of claim 5, further comprising:
depositing a nonconductive material over the diffusion barrier layer to form a buffer layer; and
forming a plurality of conductive contacts through the buffer layer, the diffusion barrier layer and the FEOL layer, the step of forming the plurality of conductive contacts comprising:
forming a first set of one or more contact openings through the buffer layer, the diffusion barrier layer and the FEOL layer to connect to connections in the RDL, and
forming a second set of one or more contacts openings through the buffer layer and the diffusion barrier layer to connect to a backside of at least one of the one or more active devices; and
depositing conductive material at least onto sides of the first and second sets of one or more contact openings.

9. The method of claim 1, wherein the thinning step further comprises: depositing one or more metal layers over the thinned silicon substrate layer to enhance backside conductive connection to the one or more silicon regions.

10. The method of claim 1, further comprising after the one or more IC dies are mounted on the side of the RDL opposite the FEOL layer, encapsulating the one or more IC dies with resin.

11. The method of claim 1, further comprising after the one or more IC dies are mounted on the side of the RDL opposite the FEOL layer and encapsulated by resin, attaching a stiffener plate onto the one or more IC dies.

12. A fan-out wafer-level package (FO-WLP) for mounting one or more integrated circuit (IC) dies thereon, comprising:
a redistribution layer (RDL) comprising metallization layers for connecting the one or more IC dies to one or more active devices when the one or more IC dies are mounted on a first side of the RDL;
a front-end-of-line (FEOL) layer, wherein a first side of the FEOL layer adjoins a second side of the RDL and has the one or more active devices partly formed therein, the second side of the RDL opposite the first side of the RDL;
one or more silicon regions formed on a second side of the FEOL layer in a thinned silicon layer, wherein one or more diffusion layers for sources and drains of the one or more active devices are formed in the one or more silicon regions of the thinned silicon layer;
a nonconductive material layer formed over the one or more silicon regions and the second side of the FEOL layer; and
a diffusion barrier layer formed over the second side of the FEOL layer and the one or more silicon regions and below the nonconductive material layer.

13. The FO-WLP of claim 12, further comprising:
a first set of one or more conductive contacts formed through the nonconductive material layer and the FEOL layer to connect to connections in the RDL, the first set of one or more conductive contacts passing through the FEOL layer at locations other than where the one or more active devices are formed.

14. The FO-WLP of claim 13, wherein the first set of one or more conductive contacts comprises at least a conductive layer formed along sides of one or more openings formed through the nonconductive material layer and the FEOL layer to provide connection from the RDL to outside the FO-WLP, wherein the first set of one or more conductive contacts are formed through areas of the nonconductive material layer and the FEOL layer that do not comprise the one or more active devices.

15. The FO-WLP of claim 12, further comprising:
a second set of one or more conductive contacts formed through the nonconductive material layer to provide connection from a backside of at least one of the one or more active devices to outside the FO-WLP.

* * * * *